US 6,661,694 B2

(12) United States Patent
Kund et al.

(10) Patent No.: US 6,661,694 B2
(45) Date of Patent: Dec. 9, 2003

(54) CONFIGURATION AND METHOD FOR INCREASING THE RETENTION TIME AND THE STORAGE SECURITY IN A FERROELECTRIC OR FERROMAGNETIC SEMICONDUCTOR MEMORY

(75) Inventors: Michael Kund, München (DE); Reinhard Salchner, Haar (DE)

(73) Assignee: Infineon Technologies AG, Munich (DE)

( * ) Notice: Subject to any disclaimer, the term of this patent is extended or adjusted under 35 U.S.C. 154(b) by 11 days.

(21) Appl. No.: 10/000,691

(22) Filed: Nov. 15, 2001

(65) Prior Publication Data

US 2002/0071303 A1 Jun. 13, 2002

(30) Foreign Application Priority Data

Nov. 15, 2000 (DE) .......................... 100 56 546

(51) Int. Cl.$^7$ ............................................. G11C 11/22
(52) U.S. Cl. ............. 365/145; 365/189.01; 365/185.04; 711/107; 711/143
(58) Field of Search ........................... 365/145, 189.01, 365/185.04; 711/107, 143

(56) References Cited

U.S. PATENT DOCUMENTS

| | | | | |
|---|---|---|---|---|
| 5,021,993 A | * | 6/1991 | Matoba et al. | 364/900 |
| 5,912,835 A | | 6/1999 | Katoh | 365/145 |
| 5,935,257 A | | 8/1999 | Nishimura | 365/145 |
| 6,078,516 A | * | 6/2000 | Hayashi | 365/145 |
| 6,317,356 B1 | * | 11/2001 | Hoffmann et al. | 365/145 |

OTHER PUBLICATIONS

Search Report issued by the German Patent and Trademark Office on May 21, 2001.

* cited by examiner

Primary Examiner—David Nelms
Assistant Examiner—Connie C. Yoha
(74) Attorney, Agent, or Firm—Laurence A. Greenberg; Werner H. Stemer; Ralph E. Locher

(57) ABSTRACT

A configuration and a method for increasing the retention time and the storage security in a ferroelectric or ferromagnetic semiconductor memory utilize the imprint effect for increasing the remanent polarization or remanent magnetization of a material having a hysteresis property. The remanent polarization or magnetization is increased by writing a memory content a number of times to the same memory cells.

10 Claims, 2 Drawing Sheets

$|P_r| \gg |-P_r|$

CONFIGURATION AND METHOD FOR INCREASING THE RETENTION TIME AND THE STORAGE SECURITY IN A FERROELECTRIC OR FERROMAGNETIC SEMICONDUCTOR MEMORY

BACKGROUND OF THE INVENTION

Field of the Invention

The invention relates to a configuration and a method for increasing the retention time and the storage security in a memory such as a ferroelectric memory or a ferromagnetic memory.

The retention time and the storage security of a ferroelectric or ferromagnetic semiconductor memory realized in a memory chip are critical parameters for a large number of applications of the semiconductor memories. This is because the retention time and ultimately also the storage security are determined, in all technologies used hitherto, by the "inadequacy" of the material respectively used. A DRAM (dynamic RAM) is used as an example for this problem; in a DRAM, the limiting factor for the retention time is given by the loss of charge of the storage capacitor on account of various material-dependent leakage mechanisms. In order to compensate for this loss of charge, refresh cycles are required in DRAMs.

In DRAMs this loss of charge is so great that they are referred to as volatile semiconductor memories. Without the refresh cycles, the retention time in DRAMs would be insufficient for practical applications.

However, also in so-called nonvolatile semiconductor memories, such as the ferroelectric semiconductor memories (FeRAMs) and the ferromagnetic semiconductor memories (MRAMs), the retention time plays a part that should not be underestimated. This is because, in FeRAMs and MRAMs, too, losses of polarization (FeRAM) or magnetization (MRAM) can be observed over relatively long periods of time.

Ferroelectric and ferromagnetic materials have the property that their hysteresis loop, in which the dependence of the polarization and magnetization, respectively, on the electric and magnetic field, respectively, is plotted, shifts in the event of frequently repeated iteration depending on the direction of the applied electric and magnetic field, respectively. This is an effect intrinsic to the ferroelectric and ferromagnetic materials (imprint effect).

SUMMARY OF THE INVENTION

It is accordingly an object of the invention to provide a configuration and a method for increasing the retention time and the storage security in a ferroelectric or ferromagnetic semiconductor memory in which the retention time and the storage security can be considerably increased through the use of simple measures.

With the foregoing and other objects in view there is provided, in accordance with the invention, a configuration for increasing a storage retention time and a storage security, including:

a memory cell array having a cell array content, the memory cell array including a plurality of memory cells including a material having a hysteresis property, the memory cells having respective cell contents and being provided in rows and columns;

a row decoder and a column decoder connected to the memory cell array for writing to the memory cells;

an evaluation unit connected to the memory cell array, the evaluation unit being configured to evaluate the cell contents of the memory cells;

a write-back register operatively connected to the evaluation unit, the write-back register being configured such that at least part of the cell array content can be written back N times into the write-back register, N being a number at least equal to one; and a write-back controller connected to the write-back register, the write-back controller controlling a rewriting of the at least part of the cell array content, which has been written back to the write-back register, to the memory cell array via the row decoder and the column decoder.

The configuration according to the invention and the method according to the invention advantageously utilize the abovementioned intrinsic effects of the ferroelectric and ferromagnetic materials. Since, as a result of a frequently repeated iteration of the respective hysteresis loop, the latter shifts depending on the direction of the applied electric or magnetic field, it is possible in this way to increase the remanent polarization or the remanent magnetization, respectively, i.e. the magnitude of the stored digital signal, and hence the retention time as well. By way of example, if a positive electric field is frequently applied to a ferroelectric material, then its hysteresis loop shifts in the direction of this electric field, as a result of which the negative remanent polarization increases on account of the intrinsic effect, which means that the retention time is increased.

The configuration according to the invention can readily be integrated into the memory chips of FeRAMs or MRAMs. The application of the invention is particularly advantageous when a memory chip with a FeRAM or MRAM that has to comply with a high retention time or storage security, which is applicable for example when the memory chips are used in cards for access control or the memory chips generally contain personal information.

The configuration according to the invention or the method according to the invention thus makes it possible to combine the advantages of fast writing, a low voltage used, and high rewriteability of FeRAMs or MRAMs with a long retention time and hence storage security of a flash memory.

The configuration according to the invention is constructed relatively simply since it essentially requires only a write-back register and a write-back controller. The content of memory cells of a memory cell array is written back to the write-back register N times (N≧1). In this case, N≧1 preferably holds true, where N may be, for example, between 100 and 1000 or, alternatively, greater than 1000. The write-back controller allows the content of memory cells of the memory cell array that has been written back to the write-back register to be rewritten to the memory cell array via the row decoder and column decoder present anyway.

According to another feature of the invention, a write-back counter is connected to the write-back controller, the write-back counter counts the number N corresponding to a number of times the at least part of the cell array content has been written back to the write-back register.

According to yet another feature of the invention, a start/stop address buffer is connected to the write-back controller, the start/stop address buffer defines a given area in the memory cell array to be written back N times to the write-back register.

According to another feature of the invention, a write-back counter buffer is connected to the write-back counter for inputting the number N corresponding to a number of times the at least part of the cell array content is to be written back to the write-back register.

According to another feature of the invention, the memory cells are ferromagnetic memory cells or ferroelectric memory cells.

With the objects of the invention in view there is also provided, a method for increasing a retention time and a storage security in a semiconductor memory, the method includes the steps of:

provinding a memory cell array including a plurality of memory cells including a material having a hysteresis property; and increasing a remanent polarization or a remanent magnetization by N times performing the operations of writing a memory content of given ones of the memory cells to the semiconductor memory, evaluating, buffer-storing, and rewriting the memory content into the given ones of the memory cells, with N being a number at least equal to one.

The method according to the invention can be performed with only a few method steps.

Firstly, the information to be stored is written to a memory cell array. Afterwards, a special write-back mode is initiated, in which it is defined how often the respective data of the individual memory cells is to be written back, which can be done for example N times (N≧1). Through the use of the write-back controller, each memory cell is then read out to the write-back register, its content is evaluated and the same memory cell is written to again N times after N-fold evaluations. The number N of read-out and rewriting can be set in a write-back counter. The time required for writing back can be reduced by writing to a plurality of memory cells simultaneously.

By specifying start and stop addresses of a memory cell array area to be written, it is possible to provide only a part of the respective memory chip with the configuration according to the invention, or to subject it to the method according to the invention, with the result that the polarization or magnetization and hence both the retention time and the storage security, for example relative to an elevated temperature, are increased exclusively in the part.

Other features which are considered as characteristic for the invention are set forth in the appended claims.

Although the invention is illustrated and described herein as embodied in a configuration and a method for increasing the retention time and the storage security in a ferroelectric or ferromagnetic semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
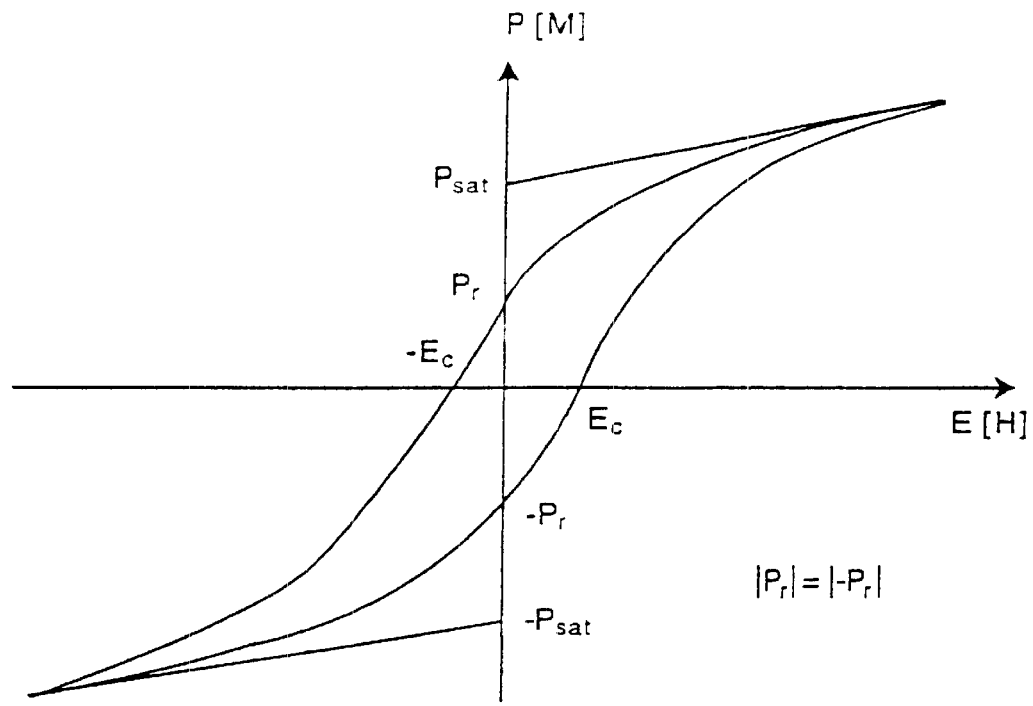
FIG. 1 is a graph for illustrating the normal state of a hysteresis in the case of a ferroelectric memory cell.
Figure 2:
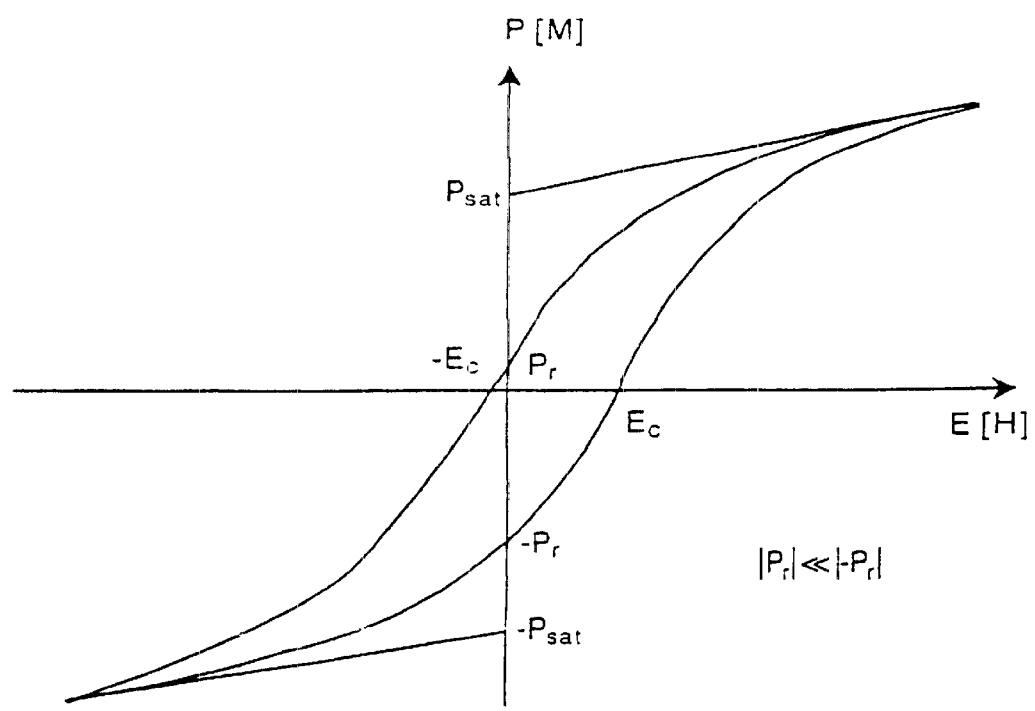
FIG. 2 is a graph for illustrating the state of a hysteresis after frequent application of a positive electric field to a ferroelectric memory cell.
Figure 3:
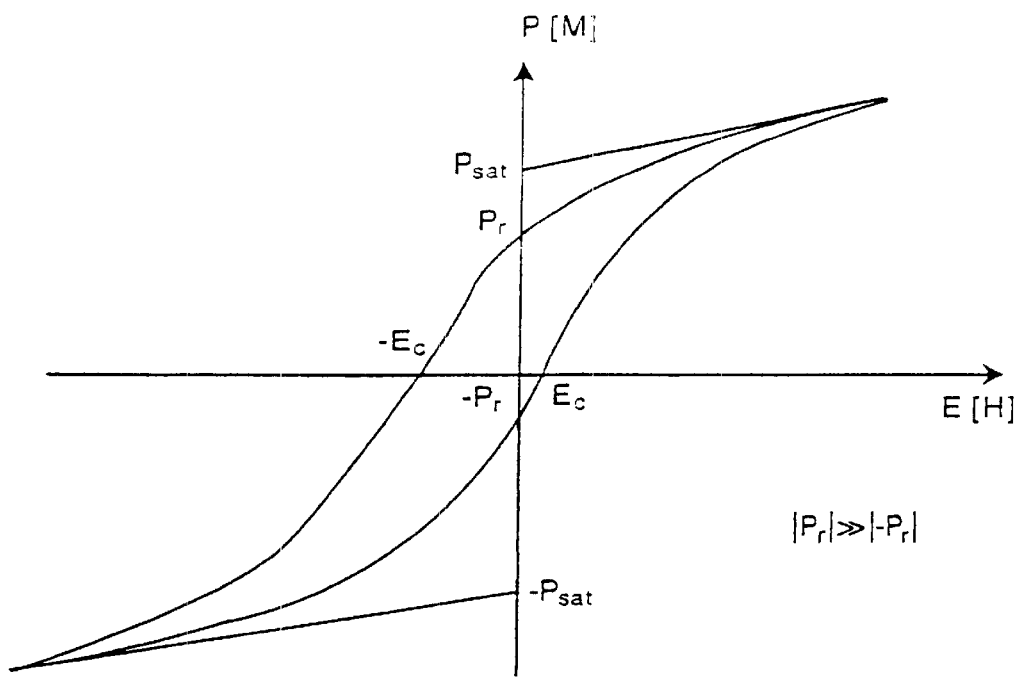
FIG. 3 is a graph for illustrating the state of a hysteresis after frequent application of a negative electric field to a ferroelectric memory cell.

Referring now to the figures of the drawings in detail and first, particularly, to FIGS. 1 to 3 thereof, there are shown hysteresis curves for a ferroelectric material. The polarization P is in each case plotted as a function of the applied electric field E.

Corresponding hysteresis curves are obtained for magnetic material when their magnetization M is evaluated as a function of an applied magnetic field H. Accordingly, in addition to the polarization P and the electric field E, the magnetization M and the magnetic field H are also entered in brackets on the axes of the hysteresis curves in FIGS. 1 to 3.

FIG. 1 shows the normal state of the hysteresis loop P(E), that is to say the profile of the polarization P as a function of the applied electric field E. In this case, the magnitude of the remanent polarization Pr is the same irrespective of the direction of the applied electric field E, i.e. $|P_r|=|-P_r|$.

FIG. 2 illustrates the profile of the hysteresis loop P(E) as occurs after frequent application of a positive electric field +E. Such a positive electric field +E is required for example to write a "1". In this case, however, $|-P_r|$ is considerably greater than $|P_r|$, which can be attributed to the intrinsic effect (imprint) explained above. In other words, the polarization is considerably greater after frequent application of a positive electric field +E, which means that the retention time is prolonged and, in addition, the storage security is increased.

FIG. 3 shows the hysteresis loop P(E) shifted to the left from the normal state of FIG. 1, as is obtained after frequent application of a negative electric field −E. Such a negative electric field −E can be assigned to the writing of a "0". In this case, the positive polarization $|P_r|$ is considerably greater than the negative polarization $|-P_r|$. In other words, through multiple application of the negative electric field, the polarization for writing a "0" signal, for example, can be amplified and the retention time and storage security can thus be increased. For the sake of completeness, the saturation polarization $P_{sat}$ and $-P_{sat}$ and the coercive field $E_c$ and $-E_c$ for the case of a ferroelectric material are also entered in FIGS. 1 to 3.

Figure 4:
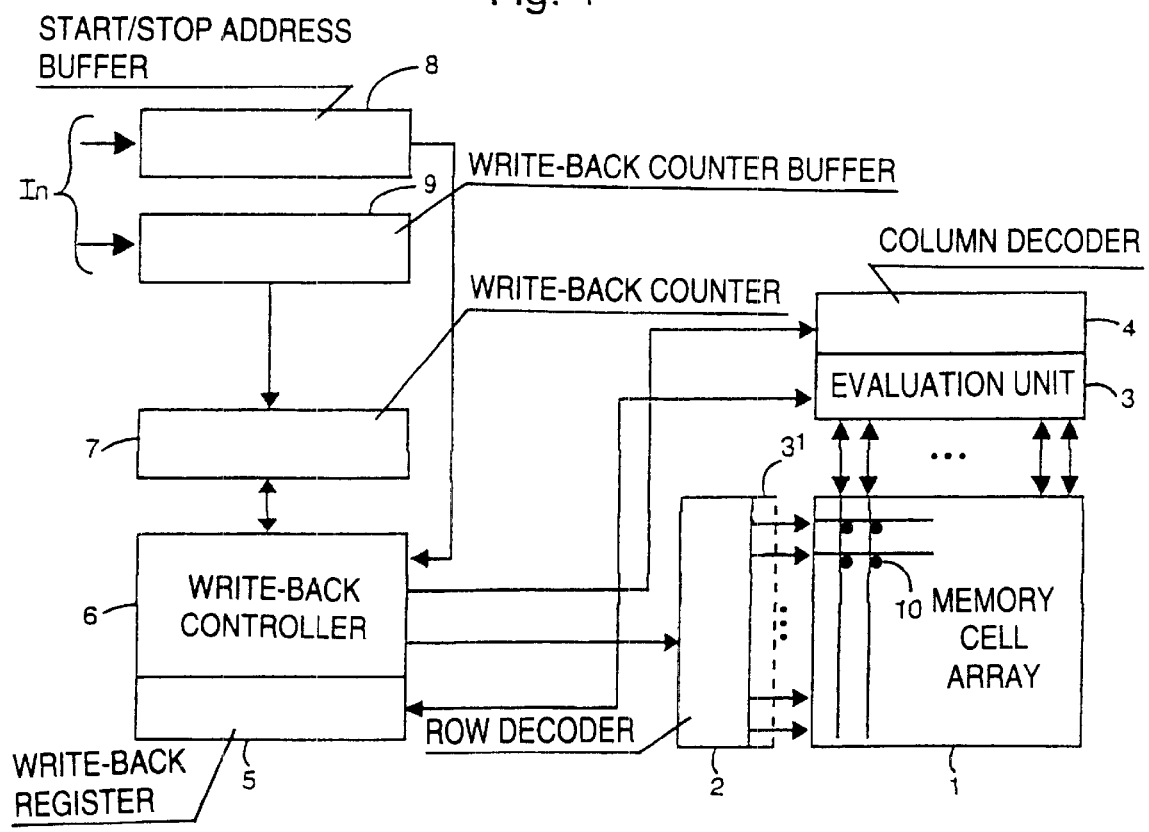
FIG. 4 is a block diagram of the configuration according to the invention.

FIG. 4 shows a block diagram of the configuration according to the invention. A memory cell array 1 is connected to a row decoder 2 and, via an evaluation unit 3, to a column decoder 4. The row decoder 2 and the column decoder 4 are each connected to a write-back controller 6, which is connected to the evaluation unit 3 via a write-back register 5. The write-back controller 6 is connected to a write-back counter 7. Also provided are a start/stop address buffer 8 and a write-back counter buffer 9, which are connected between inputs In and the write-back controller 6 and the write-back counter 7, respectively.

Instead of being connected to the column decoder 4, the evaluation unit 3 can also be connected to the row decoder 2, as is indicated by a reference symbol $3^1$.

Addresses are input into the write-back controller 6 via the start/stop address buffer 8, which addresses define a specific area in the memory cell array in which the memory cells are to be subjected to repeated writing-back in order to increase their polarization. This area may, if appropriate, also encompass the entire memory cell array 1.

The write-back counter buffer 9 serves for inputting a number N with which the individual memory cells are to be written back.

If the information to be stored has been written to the memory cell array 1 in the normal way and the remanent polarization is to be increased in order to increase the retention time and the storage security, the memory chip is put into the write-back mode by the number N for the writing-back being input into the write-back counter buffer 9 and the addresses of the memory cells of the memory cell array 1 that are to be written back being input into the start/stop address buffer 8. Afterward, via the decoders 2 and 4 and also the evaluation unit 3, the write-back controller 6 reads out each memory cell, if appropriate a plurality of memory cells simultaneously, evaluates the content thereof and transfers the content into the write-back register 5. After every readout of the content of the respective memory cells of the memory cell array 1 into the write-back register 5, the content is rewritten to the corresponding memory cells. In other words, a memory content "0" or "1" is in each case input into the memory cells that are to be written to repeatedly, with the result that the hysteresis state of FIG. 2 or 3 with an increased polarization in each case is present in the memory cell.

The configuration according to the invention and the method according to the invention thus advantageously utilize the intrinsic effect of "imprinting" in order to increase the retention time and hence the storage security as well in the memory chip having ferroelectric or ferromagnetic materials, that is to say an FeRAM or an MRAM, respectively.

The outlay for the configuration according to the invention is extremely low, as revealed by the example of FIG. 4. Since the writing-back of the memory cells can be performed very rapidly through the use of the write-back controller 6 and the write-back register 5, the method according to the invention can be performed in a short time, with the result that overall the outlay in respect of circuitry and time for realizing the increased polarization or magnetization for an FeRAM or MRAM, respectively, is extremely low.

The invention can be applied to all memory materials having hysteresis properties. In this respect, then, it is not restricted to FeRAMs and MRAMs.

We claim:

1. A configuration for increasing a storage retention time and a storage security, comprising:
   a memory cell array having a cell array content, said memory cell array including a plurality of memory cells including a material having a hysteresis property, said memory cells having respective cell contents and being provided in rows and columns;
   a row decoder and a column decoder connected to said memory cell array for writing to said memory cells;
   an evaluation unit connected to said memory cell array, said evaluation unit being configured to evaluate the cell contents of said memory cells;
   a write-back register operatively connected to said evaluation unit, said write-back register being configured such that at least part of the cell array content can be written back N times into said write-back register, N being a number at least equal to one; and
   a write-back controller connected to said write-back register, said write-back controller controlling a rewriting of the at least part of the cell array content, which has been written back to said write-back register, to said memory cell array via said row decoder and said column decoder.

2. The configuration according to claim 1, including a write-back counter connected to said write-back controller, said write-back counter counting the number N corresponding to a number of times the at least part of the cell array content has been written back to said write-back register.

3. The configuration according to claim 1, including a start/stop address buffer connected to said write-back controller, said start/stop address buffer defining a given area in said memory cell array to be written back N times to said write-back register.

4. The configuration according to claim 1, including a write-back counter buffer, operatively connected to said write-back register, for inputting the number N corresponding to a number of times the at least part of the cell array content is to be written back to said write-back register.

5. The configuration according to claim 2, including a write-back counter buffer, connected to said write-back counter, for inputting the number N corresponding to a number of times the at least part of the cell array content is to be written back to said write-back register.

6. The configuration according to claim 1, wherein said memory cells are ferromagnetic memory cells.

7. The configuration according to claim 1, wherein said memory cells are ferroelectric memory cells.

8. A method for increasing a retention time and a storage security in a semiconductor memory, the method which comprises:
   providing a memory cell array including a plurality of memory cells including a material having a hysteresis property; and
   increasing a property selected from the group consisting of a remanent polarization and a remanent magnetization by N times performing the operations of writing a memory content of given ones of the memory cells to the semiconductor memory, evaluating, buffer-storing, and rewriting the memory content into the given ones of the memory cells, with N being a number at least equal to one.

9. The method according to claim 8, which comprises using ferromagnetic memory cells as the memory cells.

10. The method according to claim 8, which comprises using ferroelectric memory cells as the memory cells.

* * * * *